(12) United States Patent  
Takahashi et al.

(10) Patent No.: US 8,335,089 B2
(45) Date of Patent: Dec. 18, 2012

(54) DISPLAY APPARATUS

(75) Inventors: Shohei Takahashi, Moriguchi (JP); Masaya Nakamichi, Kizugawa (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 207 days.

(21) Appl. No.: 12/837,036

(22) Filed: Jul. 15, 2010

(65) Prior Publication Data
US 2011/0013371 A1 Jan. 20, 2011

(30) Foreign Application Priority Data

Jul. 15, 2009 (JP) ................................ 2009-166455

(51) Int. Cl.
*H05K 7/02* (2006.01)
*H05K 7/04* (2006.01)
(52) U.S. Cl. .................. 361/810; 361/807; 361/755
(58) Field of Classification Search ............. 361/679.27, 361/755, 807, 728–730, 715, 796, 752, 800, 361/810; 312/223.1, 223.2
See application file for complete search history.

(56) References Cited

U.S. PATENT DOCUMENTS

| 5,351,176 | A  | * | 9/1994  | Smith et al.     | 361/679.27 |
| 5,631,805 | A  | * | 5/1997  | Bonsall          | 361/679.27 |
| 5,636,101 | A  | * | 6/1997  | Bonsall et al.   | 361/679.27 |
| 6,788,786 | B1 | * | 9/2004  | Kessler et al.   | 379/413.04 |
| 7,330,546 | B2 | * | 2/2008  | Kessler et al.   | 379/413.04 |
| 7,589,277 | B2 | * | 9/2009  | Kessler et al.   | 174/50     |
| 2008/0236005 | A1 | * | 10/2008 | Isayev et al.  | 40/574     |

FOREIGN PATENT DOCUMENTS

| JP | 2005286987 | 10/2005 |
| JP | 2007159645 | 6/2007  |

\* cited by examiner

*Primary Examiner* — Hung S Bui
(74) *Attorney, Agent, or Firm* — NDQ&M Watchstone LLP

(57) ABSTRACT

A display apparatus has an image display panel accommodated in a housing, a circuit board which controls operation of the image display panel, and an installation plate arranged on a rear side of the image display panel. Here, the circuit board is installed on the installation plate, and the installation plate is rotatable with respect to the housing.

1 Claim, 4 Drawing Sheets

DISPLAY APPARATUS

The Japanese patent application Number 2009-166455, upon which this patent application is based, is hereby incorporated by reference.

BACKGROUND OF THE INVENTION

1. Field of the Invention

The present invention relates to a display apparatus with a flat image display panel.

2. Description of Related Art

In recent years, flat panel display apparatuses for outdoor installation have appeared. In the apparatus, a circuit board which controls a display panel (liquid crystal panel) is arranged on a rear side of the panel. Therefore, when doing maintenance of the panel from its rear side, it is necessary to remove the circuit board. In the flat panel display apparatus for outdoor installation a large-sized panel is often employed and thus the removal of the circuit board often involves complicated work.

Due to the growth of the panel in size, a housing also grows in size. When doing maintenance of the panel, a part of the housing needs to be removed. This could lead to a falling of the part of the housing and may cause harm to a worker.

SUMMARY OF THE INVENTION

A display apparatus according to the present invention comprises an image display panel accommodated in a housing, a circuit board which controls operation of the image display panel, and an installation plate arranged on a rear side of the image display panel. Here, the circuit board is installed on the installation plate, and the installation plate is rotatable with respect to the housing.

DETAILED DESCRIPTION OF THE PREFERRED EMBODIMENT

A display apparatus according to a preferred embodiment of the present invention is discussed in detail below with reference to drawings.

Figure 1:
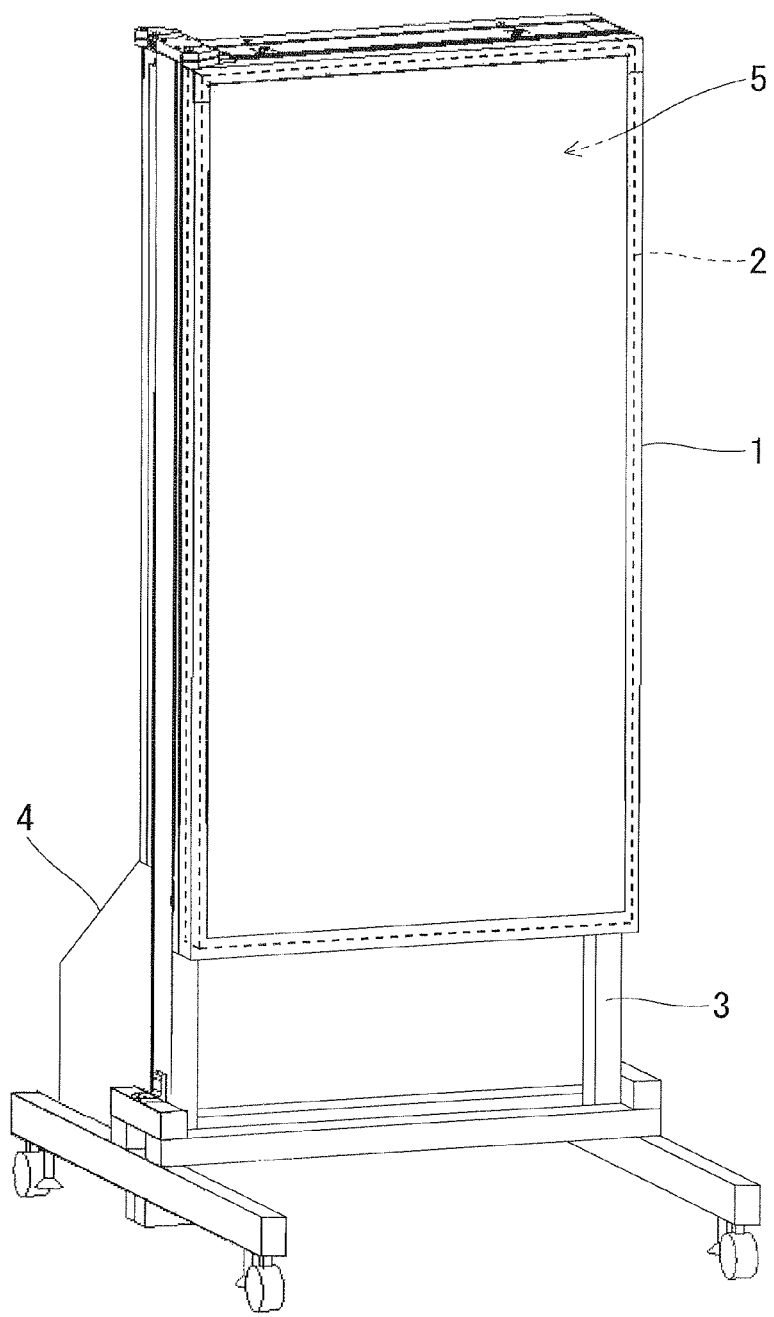
FIG. 1 is a perspective view of a display apparatus according to one embodiment of the present invention seen from a front side.

FIG. 1 is a perspective view of the display apparatus seen from a front side. As shown in FIG. 1, the display apparatus comprises a housing 1, a liquid crystal display panel 2 arranged in the housing 1, a support base 3 with casters for supporting the housing 1, and a cooling device 4.

Inside the housing 1, formed is an accommodation chamber 5 where the panel 2 is accommodated. The accommodation room 5 has a structure in which an air inside is sealed. Therefore, the panel 2 in the chamber 5 does not contact outside air, and thus an outdoor installation of the display apparatus is enabled. That is, the panel 2 in the chamber 5 is protected from weather and dust when the apparatus is installed outdoors. Also, the cooling device 4 comprises an evaporator, a condenser, and a compressor (not shown). The air in the chamber 5 is cooled by the cooling device 4. The air cooled by the cooling device 4 circulates around the panel 2 in the chamber 5 by a blower device such as a fan or the like, thereby cooling the panel 2.

Figure 2:
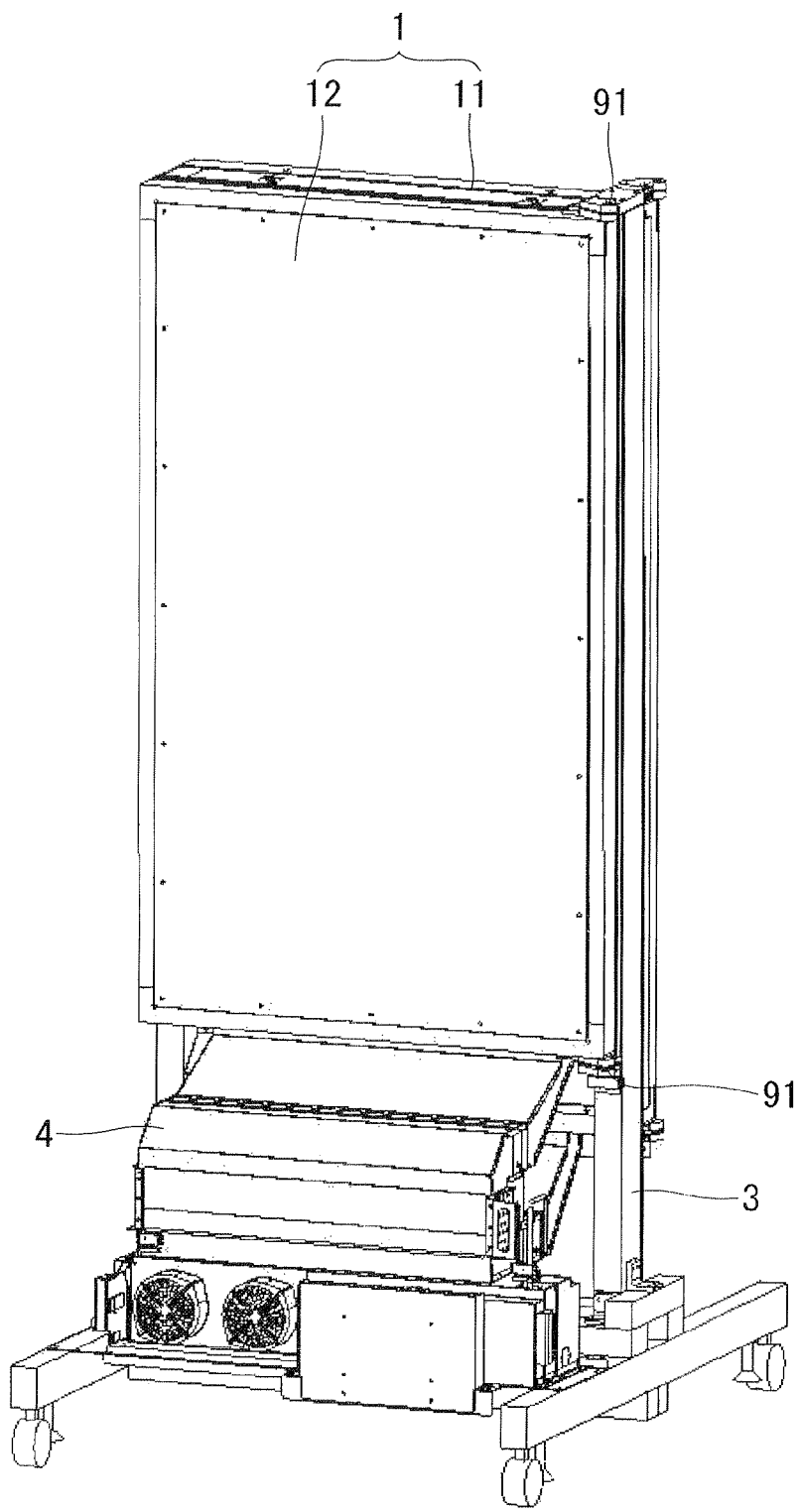
FIG. 2 is a perspective view of the display apparatus seen from a rear side.
Figure 3:
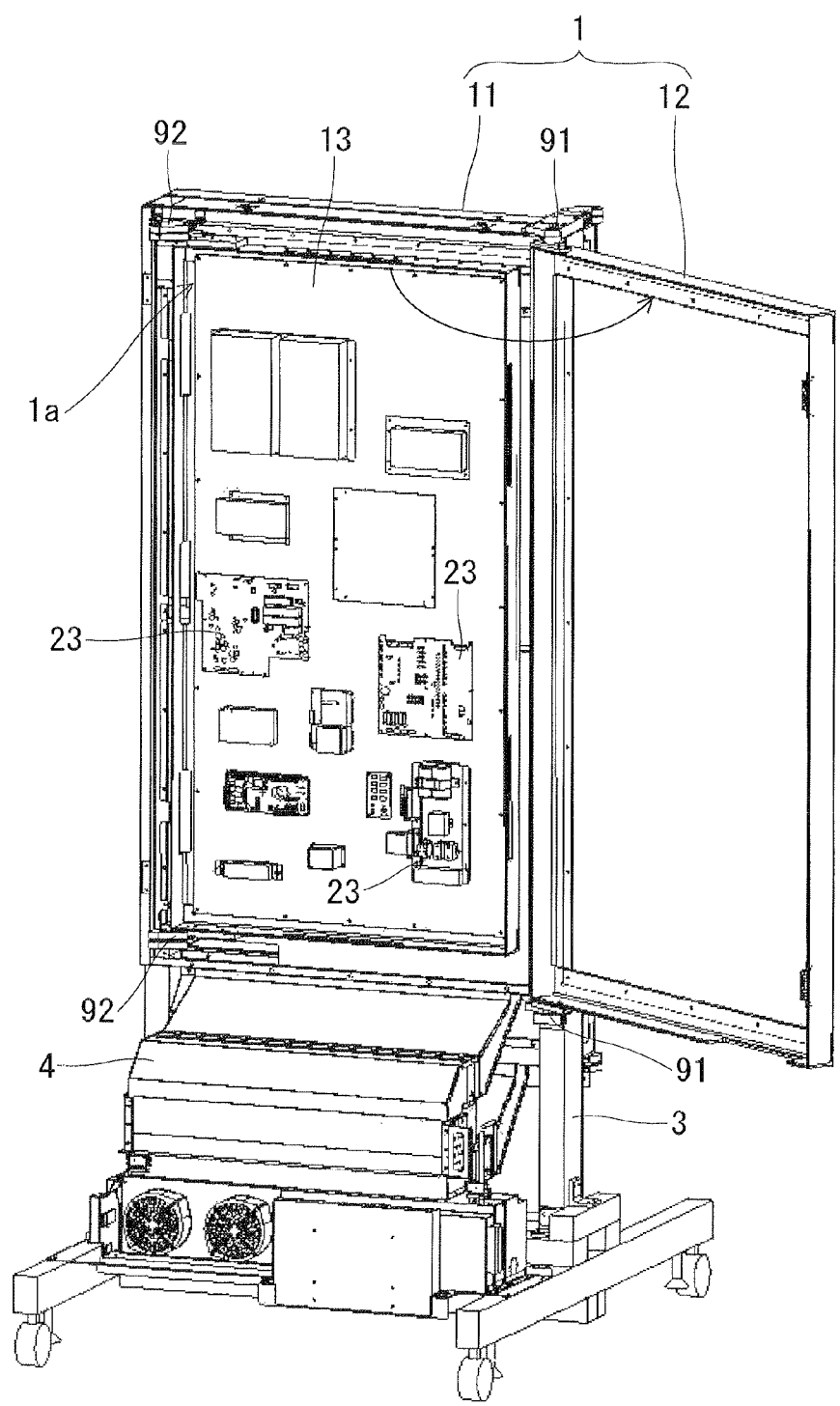
FIG. 3 is a perspective view of the display apparatus with a rear wall of a housing included in the apparatus laterally opened.
Figure 4:
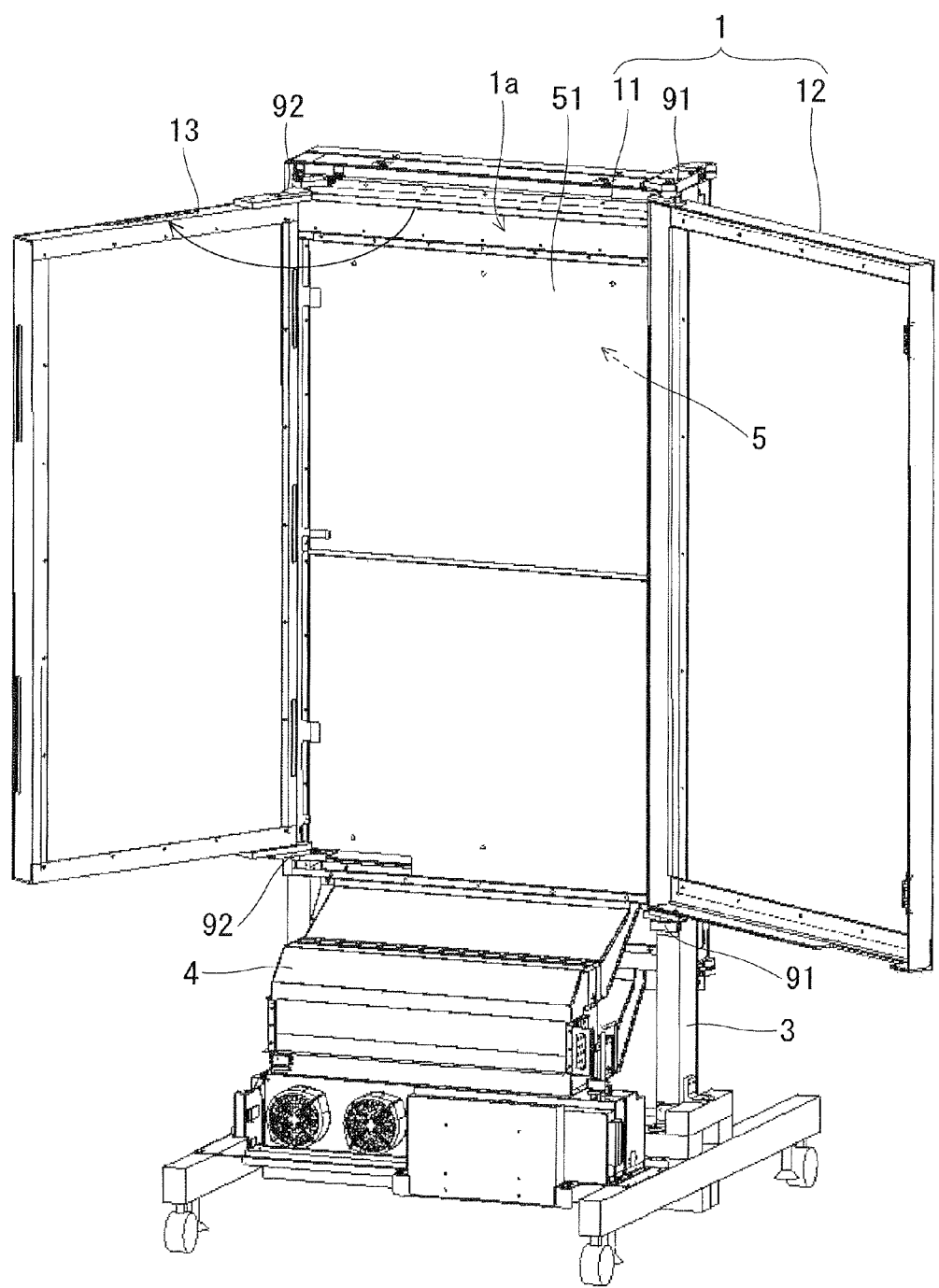
FIG. 4 is a perspective view of the display apparatus with an installation plate which is arranged in the housing laterally opened.

FIGS. 2 to 4 are perspective views of the display apparatus seen from a rear side. As shown in FIGS. 2 and 3, the housing 1 comprises a body 11 having an opening 1a on a rear surface thereof, and a rear wall 12 which covers the opening 1a. The rear wall 12 is coupled to the body 11 by a hinge mechanism 91 on one side (the right side in FIG. 3) of the housing 1, and can be opened laterally toward a direction away from a rear surface of the panel 2. Therefore, the rear wall 12 opens toward the right side of the body 11 as shown in FIG. 3.

As shown in FIG. 3, the housing 1 accommodates a plurality of circuit boards 23 which control operation of the panel 2 as well as the panel 2. The circuit boards 23 are installed on a surface of an installation plate 13 which is arranged within the housing 1.

The installation plate 13 is coupled to the body 11 of the housing 1 by a hinge mechanism 92 on the other side (the left side in FIG. 3) of the housing 1, and can be opened laterally toward a direction away from the rear surface of the panel 2. Therefore, the installation plate 13 opens toward the left side of the body 11 of the housing 1 as shown in FIG. 4.

In other words, the two hinge mechanisms 91, 92 enable the rear wall 12 and the installation plate 13 to be opened laterally and toward the opposite sides to each other.

In the display apparatus described above, since the rear wall 12 can be removed only by opening the rear wall 12 laterally, the maintenance work of the inside of the housing 1 from the rear side is eased. Especially the removing of the rear wall 12 is eased. Also, since the rear wall 12 is coupled to the body 11 by the hinge mechanism 91, the rear wall 12 does not fail from the body 11, and thus it does not cause harm to a worker.

Also, in the display apparatus described above, a rear wall 51 of the chamber 5 can be exposed as shown in FIG. 4 only by opening the rear wall 12 and the installation plate 13, on which the circuit boards 23 are installed, laterally. Therefore, during the maintenance of the inside of the chamber 5, there is no need to remove the circuit boards 23 as required conventionally. Therefore, the maintenance of the inside of the chamber 5, specifically the maintenance of the panel 2, is eased. Here, the rear wall 51 of the chamber 5 is removed during the maintenance of the inside of the chamber 5.

The present invention is not limited to the foregoing embodiment in construction but can be modified variously by one skilled in the art without departing from the spirit of the invention as set forth in the appended claims. For example, the constructions employed in the display apparatus described above can be applied to not only the display apparatus with the panel 2, but also various display apparatuses with a flat image display panel such as a plasma display panel, an organic EL (Electro-Luminescence) display panel, or the like.

What is claimed is:

1. A display apparatus comprising a housing, an image display panel accommodated in the housing, and a circuit board which is accommodated in the housing and controls operation of the image display panel, wherein inside the housing, an installation plate on which the circuit board is installed is arranged on a rear side of the image display panel, and the installation plate is coupled to the housing by a hinge mechanism and is opened laterally toward an opposite side to a rear surface of the image display panel; and further wherein the housing comprises a body provided with an opening on a rear surface thereof and a rear wall which covers the opening of the body, and the rear wall is coupled to the body of the housing by a second hinge mechanism, and is opened laterally toward an opposite side to the rear surface of the image display panel; and further wherein the second hinge mechanism enables the rear wall of the housing to be opened laterally toward an opposite side to a direction in which the installation plate is opened laterally.

* * * * *